United States Patent
Kang et al.

(10) Patent No.: US 10,170,398 B2
(45) Date of Patent: Jan. 1, 2019

(54) THREE-DIMENSIONAL INTEGRATED CIRCUIT

(71) Applicant: INDUSTRY-ACADEMIC COOPERATION FOUNDATION, YONSEI UNIVERSITY, Seoul (KR)

(72) Inventors: Sungho Kang, Seoul (KR); Dongho Kang, Seoul (KR); Ingeol Lee, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/422,578

(22) Filed: Feb. 2, 2017

(65) Prior Publication Data

US 2017/0229381 A1  Aug. 10, 2017

(30) Foreign Application Priority Data

Feb. 5, 2016 (KR) .................. 10-2016-0014745

(51) Int. Cl.
*H01L 23/48* (2006.01)
*H01L 23/525* (2006.01)
(Continued)

(52) U.S. Cl.
CPC ...... *H01L 23/481* (2013.01); *H01L 21/76892* (2013.01); *H01L 23/525* (2013.01);
(Continued)

(58) Field of Classification Search
CPC . H01L 23/481; H01L 25/0657; H01L 23/528; H01L 23/525; H01L 23/58; G06F 3/068; G06F 3/0617; G06F 3/0635
(Continued)

(56) References Cited

U.S. PATENT DOCUMENTS

| 8,242,589 | B2 * | 8/2012 | Saen | G01R 31/318513 |
| | | | | 257/686 |
| 9,136,250 | B2 * | 9/2015 | Tseng | H01L 25/0657 |
| 9,588,717 | B2 * | 3/2017 | Lo | G06F 3/0617 |

FOREIGN PATENT DOCUMENTS

| JP | 2014179433 A | 9/2014 |
| KR | 10-2013-0047056 A | 5/2013 |

(Continued)

OTHER PUBLICATIONS

Wei-Hen Lo et al., "Architecture of Ring-based Redundant TSV for Clustered Faults", 2015 Design, Automation & Test in Europe Conference& Exhibition (Date), pp. 848-853.

(Continued)

*Primary Examiner* — Dinh T Le (74) *Attorney, Agent, or Firm* — Sughrue Mion, PLLC (57) ABSTRACT

Disclosed is a three-dimensional integrated circuit divided into a plurality of groups and capable of repairing failed through-silicon vias (TSVs). In particular, the three-dimensional integrated circuit includes a plurality of through-silicon vias (TSVs) vertically penetrating the three-dimensional integrated circuit and included in each of the groups, and two or more redundant through-silicon vias (RTSVs), wherein, when the number of failed TSVs in one group exceeds a repairable number, the failed TSVs exceeding the repairable number are repaired using at least one RTSV included in another group adjacent to the group.

10 Claims, 9 Drawing Sheets

(51) Int. Cl.
  *H01L 23/528* (2006.01)
  *H01L 23/58* (2006.01)
  *H01L 25/065* (2006.01)
  *H01L 21/768* (2006.01)

(52) U.S. Cl.
  CPC ............ *H01L 23/528* (2013.01); *H01L 23/58* (2013.01); *H01L 25/0657* (2013.01); *H01L 2225/06541* (2013.01)

(58) Field of Classification Search
  USPC .......................................... 714/4.2; 327/356
  See application file for complete search history.

(56) References Cited

FOREIGN PATENT DOCUMENTS

| KR | 1020130050233 A | 5/2013 |
|---|---|---|
| KR | 1020130133748 A | 12/2013 |
| KR | 10-2015-0141349 A | 12/2015 |

OTHER PUBLICATIONS

Communication dated Mar. 15, 2017 from the Korean Patent Office in counterpart application No. 10-2016-0014745.
Communication dated May 1, 2017 from the Korean Patent Office in counterpart application No. 10-2016-0014745.

\* cited by examiner

○ THROUGH-SILICON VIA

● REDUNDANT THROUGH-SILICON VIA

◉ FAILED THROUGH-SILICON VIA

○ THROUGH-SILICON VIA
● REDUNDANT THROUGH-SILICON VIA
◉ FAILED THROUGH-SILICON VIA

THREE-DIMENSIONAL INTEGRATED CIRCUIT

CROSS-REFERENCE TO RELATED APPLICATION

This application claims the priority benefit of Korean Patent Application No. 10-2016-0014745, filed on Feb. 5, 2016 in the Korean Intellectual Property Office, the disclosure of which is incorporated herein by reference.

BACKGROUND OF THE INVENTION

Field of the Invention

The present disclosure relates to a three-dimensional integrated circuit capable of repairing failures in through-silicon vias.

Description of the Related Art

With the recent trend of high capacity, light weight and high density of electronic products, the operating voltage and size of electronic devices are also decreasing. The conventional planar two-dimensional mounting method has problems such as increase in package area due to increase in the number of I/O pads and slow signal transmission, and thus the method does not satisfy current trends in the electronics industry. Accordingly, three-dimensional packaging in which integrated circuits (ICs) are mounted by vertically stacking has been actively investigated. Recently, through-silicon via (TSV) technology of forming via holes in a silicon wafer and using the same as electrical paths has been attracting attention as one of methods described above.

However, various failures may be generated when the TSV technology is applied. For example, failures may include a void which is generated by incomplete filling of the inside of through-silicon vias (TSVs) with a conductive material in the process of forming TSVs, bump contact failure caused by bending of a semiconductor chip or movement of a bump material, a crack which occurs in a through-silicon via itself, and the like.

As described above, a TSV serves as a mediator for electrically connecting a plurality of semiconductor chips. Thus, when the TSV fails, the function thereof as an electrode cannot be normally exerted. In this case, a repair technique capable of replacing failed TSVs with normal TSVs is required.

RELATED DOCUMENTS

Patent Documents

Korean Patent Publication No. 10-2013-0047056A, "SEMICONDUCTOR INTEGRATED CIRCUIT"
Korean Patent Publication No. 10-2015-0141349A, "SEMICONDUCTOR DEVICE COMPRISING REPAIRABLE PENETRATION ELECTRODE"

Non-Patent Document

Architecture of Ring-Based Redundant TSV for Clustered Faults, Wei-Hen Lo, Kang Chi, Ting Ting Hwang

SUMMARY OF THE INVENTION

Therefore, the present invention has been made in view of the above problems, and it is an object of the present invention to provide a three-dimensional integrated circuit capable of repairing failures using redundant through-silicon vias (RTSVs) in adjacent groups when TSV failures occur beyond a repairable number in one group.

In accordance with the present invention, the above and other objects can be accomplished by the provision of a three-dimensional integrated circuit, which is divided into a plurality of groups, including a plurality of through-silicon vias (TSVs) vertically penetrating the three-dimensional integrated circuit and included in each of the groups, and two or more redundant through-silicon vias (RTSVs) vertically penetrating the three-dimensional integrated circuit and included in the respective group, wherein, when the number of failed TSVs in one group exceeds a repairable number and consequently there are not enough RTSVs in the one group to repair the failed TSVs, the failed TSVs exceeding the repairable number are repaired using at least one RTSV included in another group adjacent to the group.

In accordance with one embodiment, the adjacent group may be at least one of groups arranged to be adjacent to each of an upper side, underside, left side, right side and diagonal directions of any one group.

In accordance with one embodiment, the RTSVs may be arranged in an m×n matrix (m and n being natural numbers) together with a plurality of TSVs included in the respective group, and may be placed at each of two or more corners of the respective group.

In accordance with one embodiment, when the RTSVs are placed at each of two corners of the respective group, the RTSVs may be placed to face each other within the group including the same and are arranged to be symmetrical with respect to RTSVs included in another group adjacent to the group.

In accordance with one embodiment, TSV failures corresponding to a maximum of two times the number of RTSVs included in the respective group may be repaired using at least one RTSV included in a group adjacent to the respective group.

In accordance with one embodiment, each of the RTSVs may include the first and second demultiplexers that receive at least one first signal from at least one failed TSV in the group comprising the RTSVs and output the same, the third demultiplexer that receives the second signal from RTSVs included in the first group of the other groups adjacent to the group and outputs the same, and the fourth demultiplexer that receives the third signal from RTSVs included in the second group of the other groups adjacent to the group and outputs the same.

In accordance with one embodiment, when the first signal is received, whether the RTSV to which a corresponding first demultiplexer belongs is capable of repairing the failed TSV is determined, when the RTSV is capable of repairing the failed TSV, the first signal may be output to a signal line connected to the RTSV to which the corresponding first demultiplexer belongs, and when the RTSV is incapable of repairing the failed TSV, the first signal may be output to any one of signal lines connected to the first and second groups.

In accordance with one embodiment, when the first signal is received, whether the RTSV to which a corresponding second demultiplexer belongs is capable of repairing the failed TSV is determined, when the RTSV is capable of repairing the failed TSV, the first signal may be output to a signal line connected to the RTSV to which the corresponding second demultiplexer belongs, and when the RTSV is incapable of repairing the failed TSV, the first signal may be output to any one of signal lines connected to the first and second groups.

In accordance with one embodiment, when the RTSV to which a corresponding third demultiplexer belongs is capable of repairing a failed TSV, the received second signal may be output to a signal line connected to the RTSV, and when the RTSV to which a corresponding third demultiplexer belongs is incapable of repairing a failed TSV, the received second signal may be output to a signal line connected to the second group.

In accordance with one embodiment, when the RTSV to which a fourth demultiplexer belongs is capable of repairing a failed TSV, the received third signal may be output to a signal line connected to the RTSV, and when the RTSV to which a corresponding fourth demultiplexer belongs is incapable of repairing a failed TSV, the received third signal may be output to a signal line connected to the first group.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The present invention will now be described more fully with reference to the accompanying drawings and descriptions of the drawings, in which exemplary embodiments of the invention are shown. This invention may, however, be embodied in many different forms and should not be construed as limited to the exemplary embodiments set forth herein.

The terminology used in the present disclosure serves the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "includes" and/or "including," when used in this specification, specify the presence of stated features, steps, operations, elements, and/or components, but do not preclude the presence or addition of one or more other features, steps, operations, elements, components, and/or groups thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

Further, as used in the description of the invention and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Figure 1:
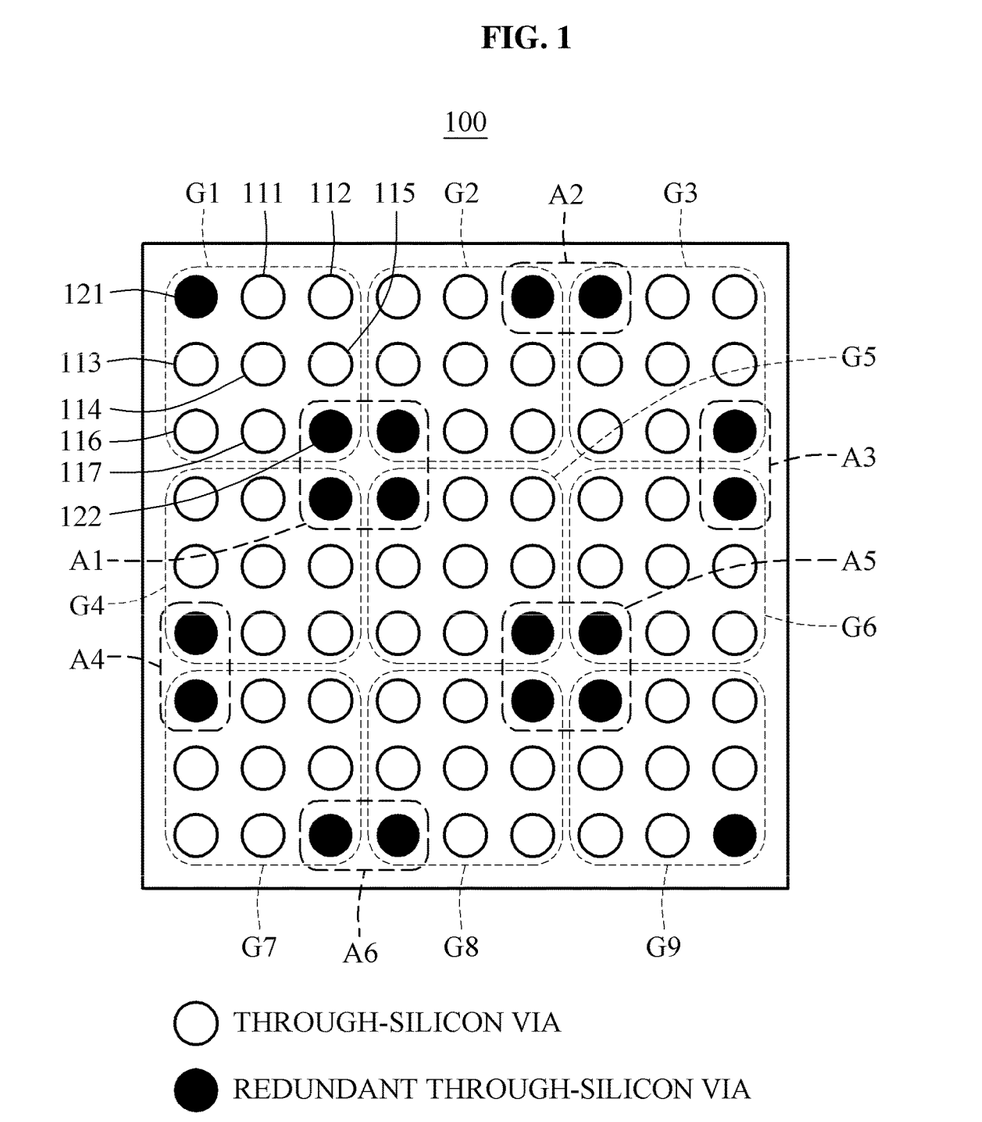
FIG. 1 illustrates a top view of a three-dimensional integrated circuit according to an embodiment of the present invention.

FIG. 1 illustrates a top view of a three-dimensional integrated circuit according to an embodiment of the present invention.

Referring to FIG. 1, a three-dimensional integrated circuit 100 includes a plurality of vertically stacked semiconductor chips (not illustrated), a plurality of through-silicon vias (TSVs) 111, 112, 113, 114, 115, 116, and 117, and a plurality of redundant through-silicon vias (RTSVs) 121 and 122.

The TSVs 111 to 117 vertically penetrate the three-dimensional integrated circuit 100, and receive various signals or power generated when the three-dimensional integrated circuit 100 is operated.

The RTSVs 121 and 122 vertically penetrate the three-dimensional integrated circuit 100, and are used to repair a failed TSV when at least one of the TSVs 111 to 117 fails.

The three-dimensional integrated circuit 100 is divided into nine groups (G1, G2, G3, G4, G5, G6, G7, G8 and G9), and each group includes seven TSVs 111 to 117 and two RTSVs 121 and 122, wherein a total of nine vias is arranged in an m×n matrix (m and n being natural numbers), for example a 3×3 matrix, and the first to ninth groups (G1 to G9) are arranged in a 3×3 matrix.

Here, the number of TSVs and the number of RTSVs included in each group and their arrangement structures are only examples, and may be changed depending upon the design of the three-dimensional integrated circuit 100.

The RTSVs 121 and 122 included in each group repair the failed TSV when at least one of the TSVs 111 to 117 fails. First, the RTSVs 121 and 122 repair at least one TSV in the group including the RTSVs.

In addition, when the number of failed TSVs exceeds a repairable number in a group including the TSVs, the failed TSVs exceeding the repairable number may be repaired using RTSVs included in another group adjacent to the group.

Therefore, the three-dimensional integrated circuit 100 shares RTSVs with adjacent groups. When there are not enough RTSVs in any one group to repair failed TSVs, RSTVs in another group adjacent to the group may be used to repair the failed TSVs.

The adjacent group may be at least one of groups arranged to be adjacent to each of an upper side, underside, left side, right side and diagonal directions of any one group.

In addition, RTSVs 121 and 122 in each group may be placed at two corners facing each other within the group including the RTSVs and are arranged to be symmetrical with respect to RTSVs included in another group adjacent to the group.

Due to the arrangement structure, RTSVs between adjacent groups may be arranged adjacent to each other, making it easy to share the RTSVs. As shown in FIG. 1, the bundles of RTSVs that can be shared between adjacent groups are denoted as A1, A2, A3, A4, A5 and A6.

Generally, the number of RTSVs must be large in order to repair TSV failures generated in each group. However, when the number of RTSVs in each group increases, the size of the three-dimensional integrated circuit 100 increases, which causes a rise in costs.

However, the three-dimensional integrated circuit 100 having the above-described structure may repair more TSV failures than the number of RTSVs even if the number of RTSVs included in each group is not increased. Thus, use of the three-dimensional integrated circuit according to the present invention may increase repair efficiency against TSV failures without increasing the size of a three-dimensional integrated circuit and without increasing costs.

FIGS. 2 to 5 illustrate a repair method according to the number of failures having occurred in through-silicon vias (TSVs) on the three-dimensional integrated circuit shown in FIG. 1.

According to examples shown in FIGS. 2 to 5, when the first group G1 is centered, the second group G2 is located on the right side of the first group G1, the fourth group G4 is located on the underside of the first group G1, and the fifth group G5 is located in the diagonal direction of the first group G1. Crosstalk for repairing failures between these groups may be equally or similarly applied to other groups.

The RTSVs 121 and 122 included in the first group G1 are placed at two corners facing each other and are arranged to be symmetrical with respect to the RTSVs 121 and 122 included in each of the second, fourth and fifth groups G2, G4 and G5.

Figure 2:
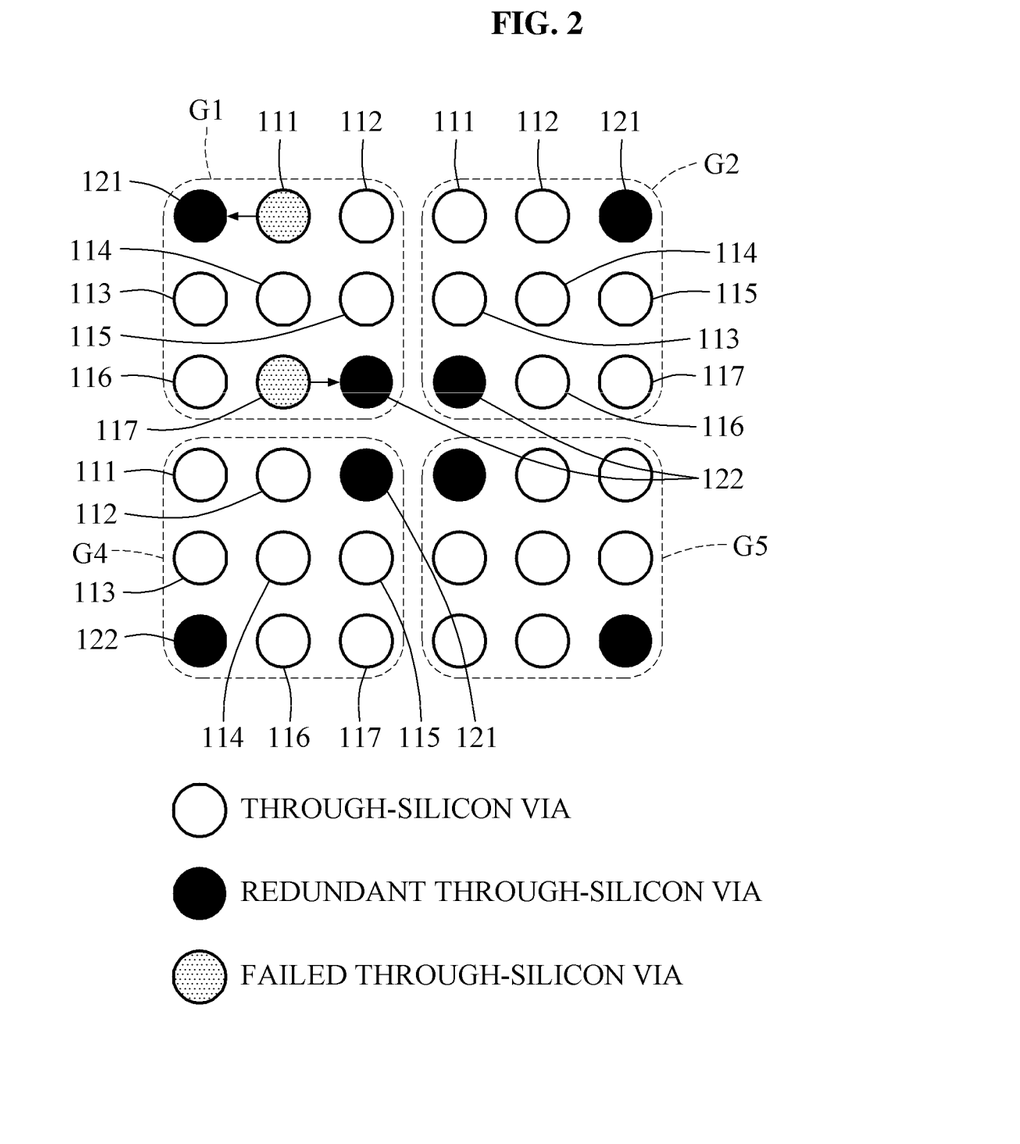
FIGS. 2 to 5 illustrate a repair method according to the number of failures having occurred in through-silicon vias (TSVs) on the three-dimensional integrated circuit shown in FIG. 1.

When two TSV failures occur in the first group G1, the failures may be repaired using two RTSVs included in the first group G1.

Specifically, the TSV failures may be repaired by shifting the signal of a first TSV 111 to a first RTSV 121 and shifting the signal of a seventh TSV 117 to a second RTSV 122.

As described above, when two TSV failures occur in the first group G1, the number of TSV failures corresponds to the repairable number within the first group G1 and thus the TSV failures may be repaired using the RTSVs 121 and 122 alone.

On the other hand, when more than two TSV failures occur in the first group G1, the TSV failures may be repaired using at least one RTSV included in adjacent groups.

Hereinafter, in the case of that TSV failures occur beyond a repairable number in one group, a failure repair operation of the three-dimensional integrated circuit 100 will be explained with reference to FIGS. 3 to 5.

Figure 3:
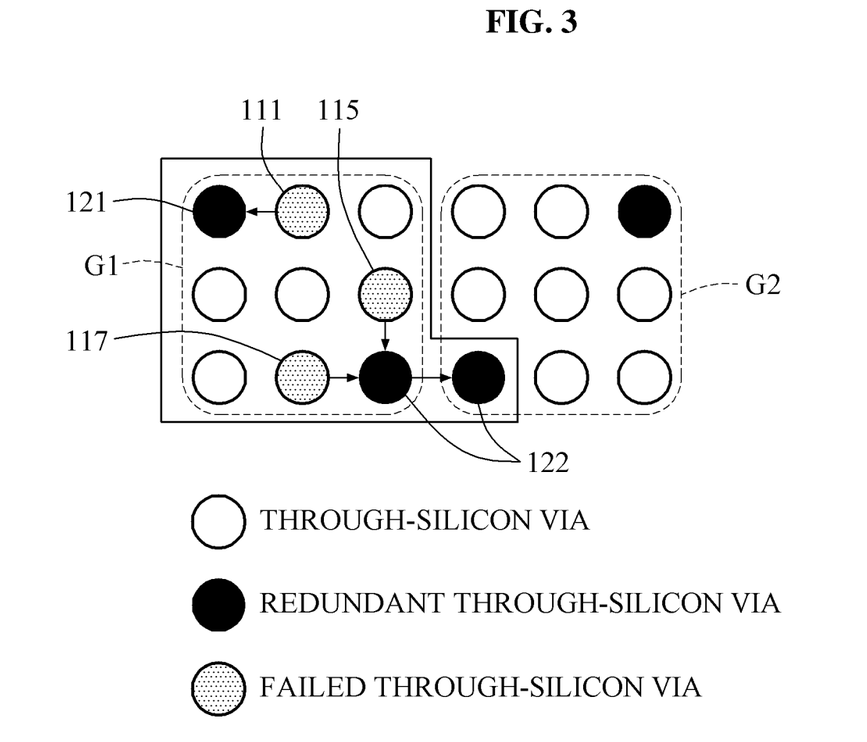

As shown in FIG. 3, when failures occur in the first TSV 111, a fifth TSV 115 and the seventh TSV 117 in the first group G1, the number of failures within the first group G1 exceeds the repairable number by one.

First, as shown in FIG. 2, when the first and seventh TSVs 111 and 117 fail to function and thus two TSV failures occur, the failures may be repaired using the first and second RTSVs 121 and 122 included in the first group G1.

Since the first group G1 is incapable of repairing the failure of the fifth TSV 115, the failure may be repaired using the RTSV 122 included in the second group G2.

Specifically, as shown in FIG. 3, the signal of the fifth TSV 115 may be shifted to the second RTSV 122 included in the second group G2. In this case, the second RTSV 122 included in the second group G2 may operate in one configuration of the first group G1.

The three-dimensional integrated circuit 100 has a structure that shares RTSVs between the first and second groups G1 and G2, and thus all three failures occurring in the first group G1 may be repaired.

In FIG. 3, a repair operation that repairs two failures in the first group G1 is described. However, when the second RTSV 122 included in the first group G1 is not working properly, the repairable number within the first group G1 is one.

Figure 4:
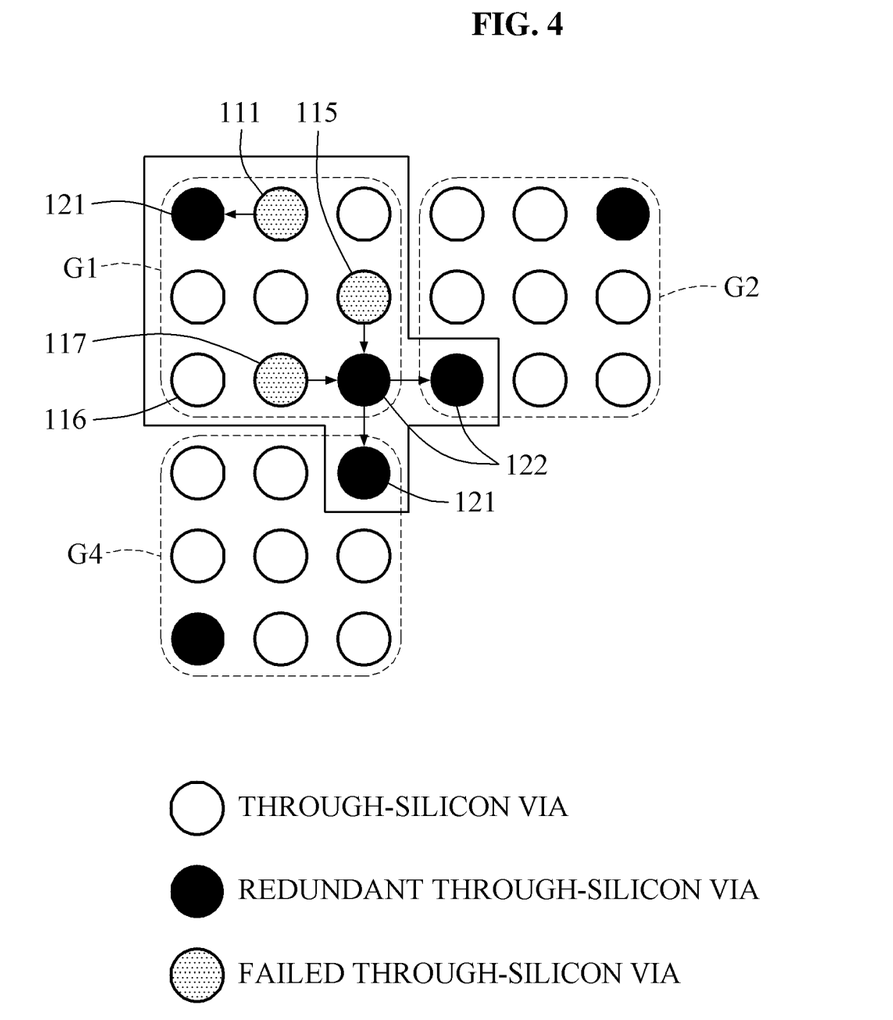

Referring to FIG. 4, a repair operation in the case where the second RTSV 122 included in the first group G1 fail will be described below.

As shown in FIG. 4, when failures occur in the first, fifth and seventh TSVs 111, 115 and 117 in the first group G1, the number of failures within the first group G1 exceeds the repairable number by one.

First, one failure is repaired by shifting the signal of the first TSV 111 to the first RTSV 121.

At this time, since a failure occurs in the second RTSV 122, the second RTSV 122 is incapable of participating in a repair operation. Accordingly, two failures may be repaired by outputting the signals of the fifth and seventh TSVs 115 and 117 to the second and fourth groups G2 and G4.

Specifically, the signal of the fifth TSV 115 is shifted to the second RTSV 122 included in the second group G2 through the second RTSV 122, and the signal of the seventh TSV 117 is shifted to the first RTSV 121 included in the fourth group G4 through the second RTSV 122.

In this case, the second RTSV 122 included in the second group G2 and the first RTSV 121 included in the fourth group G4 may operate in one configuration of the first group G1.

Since the three-dimensional integrated circuit 100 has a structure that shares RTSVs between the first and second groups G1 and G2 and shares RTSVs between the first and fourth groups G1 and G4, even if the second RTSV 122 in the first group G1 fails, all three failures occurring in the first group G1 may be repaired.

In addition, the repair operation described above is only available when the second RTSV 122 included in the second group G2 and the first RTSV 121 included in the fourth group G4 are available. In other words, each of RTSVs should be in a state in which it is normally operable and does not perform any other repair operation.

When the second RTSV 122 included in the second group G2 is repairing a failure occurred in the second group G2, a failure may be repaired using RTSVs included in an adjacent group.

Figure 5:
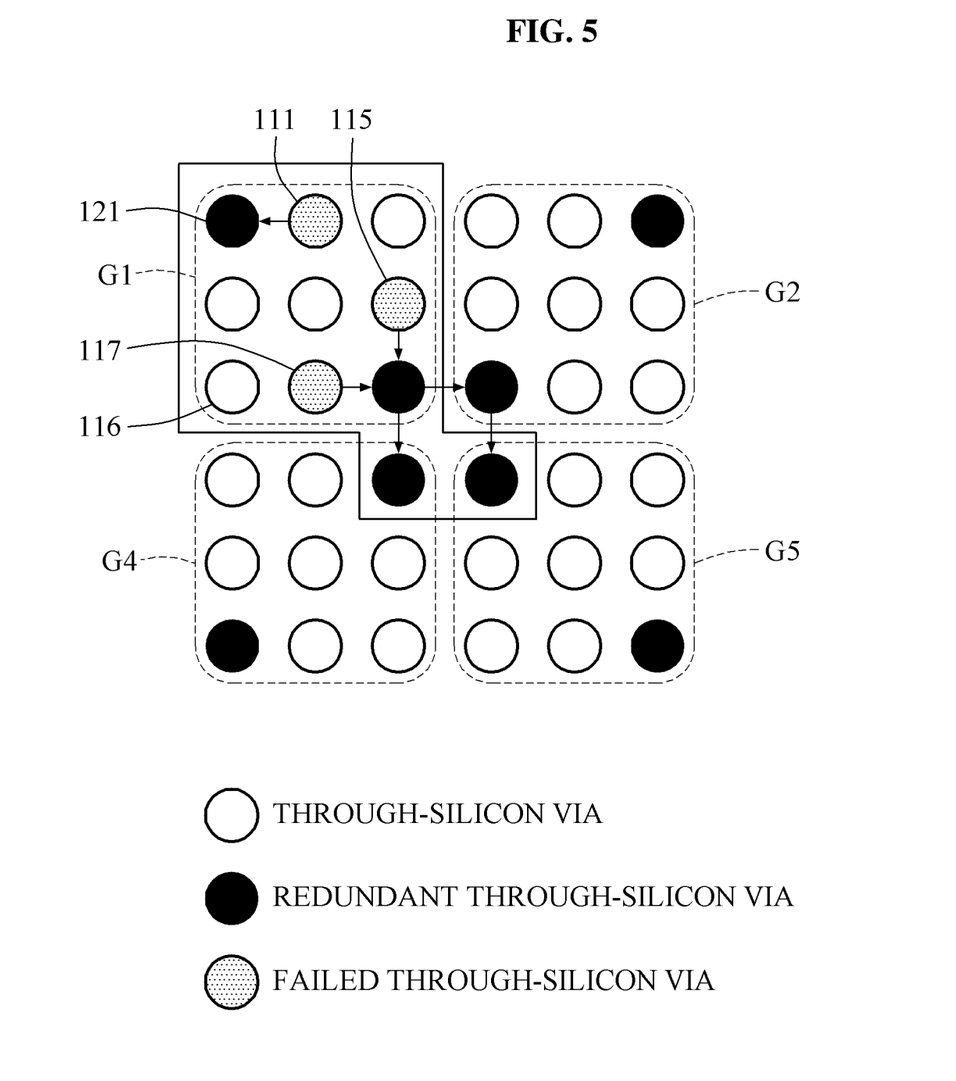

Specifically, as shown in FIG. 5, the signal of the fifth TSV 115 included in the first group G1 is shifted to the second RTSV 122 included in the second group G2.

At this time, since the second RTSV 122 included in the second group G2 is incapable of participating in a repair operation, a shifted signal is delivered to the first RTSV 121 included in the fifth group G5. Accordingly, the first RTSV 121 included in the fourth group G4 and the first RTSV 121 included in the fifth group G5 may operate in one configuration of the first group G1.

As described above, even if repair is not possible in any one adjacent group, repair efficiency may be improved by configuring the three-dimensional integrated circuit to deliver a signal to a group capable of repairing.

Although not explained, in the three-dimensional integrated circuit 100, the fifth group G5 may repair a maximum of 4 failures using RTSVs included in another groups, which are adjacent to each of the left side, right side, upper side, underside and diagonal direction of the fifth group G5.

In other words, TSV failures corresponding to a maximum of two times the number of RTSVs included in the fifth group G5 may be repaired using at least one RTSV included in another adjacent group.

Figure 6:
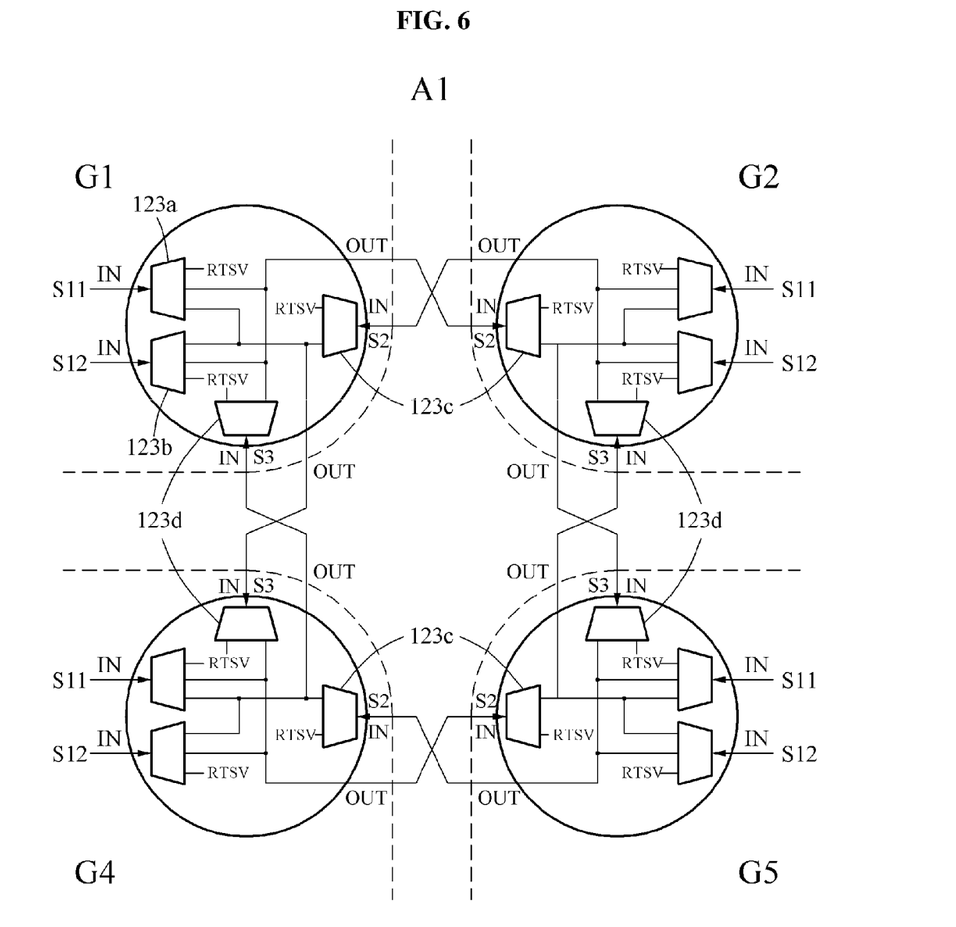
FIG. 6 illustrates a switching structure between redundant through-silicon vias (RTSVs) according to an embodiment of the present invention.

FIG. 6 illustrates a switching structure between redundant through-silicon vias (RTSVs) according to an embodiment of the present invention.

The switching structure between RTSVs shared between the first, second, fourth and fifth groups G1, G2, G4 and G5 arranged adjacent to each other is shown in the three-dimensional integrated circuit 100 illustrated in FIG. 1.

Each RTSV includes first and second demultiplexers 123a and 123b having a 1-in/3-out configuration that receives first signals S11 and S12 from at least one TSV included in a group including the respective RTSV and outputs the same, and third and fourth demultiplexers 123c and 123d having a 1-in/2-out configuration that receives each of second and third signals S2 and S3 from RTSVs within two adjacent groups and outputs the same. Hereinafter, a switching operation will be described on the basis of RTSVs included in the first group G1.

When TSV failures occur beyond a repairable number in the first group G1, the first signal S11 or S12 from the failed TSV is input to the first or second demultiplexer 123a or 123b of RTSVs.

For example, when the first signal S11 is input to the first demultiplexer 123a, the first demultiplexer 123a outputs the first signal S11 through a signal line connected to the RTSV so that the first signal S11 is processed within the RTSV.

In addition, when the two first signals S11 and S12 are input to the first and second demultiplexers 123a and 123b, respectively, the first demultiplexer 123a outputs the first signal S11 through a signal line connected to the RTSV so that the first signal S11 is processed within the RTSV.

As described above, since a repair operation for the first signal S11 is performed in the RTSV, the first signal S12 other than the first signal S11 cannot be processed within the RTSV.

Accordingly, the second demultiplexer 123b outputs the first signal S12 other than the first signal S11 through a signal line connected to the second group G2 or a signal line connected to the fourth group G4. At this time, the operations of the first and second demultiplexers 123a and 123b associated with the first signal S11 or S12 may be performed inversely. In other words, the first signal S11 may be input to the second demultiplexer 123b and the first signal S12 other than the first signal S11 may be input to the first demultiplexer 123a.

Alternatively, when the two first signals S11 and S12 are input to the first and second demultiplexers 123a and 123b, respectively, a corresponding RTSV may be already performing a repair operation or may be incapable of repairing due to a failure in the RTSV.

In this case, the first demultiplexer 123a may output the first signal S11 through a signal line connected to any one of the second and fourth groups G2 and G4, and the second demultiplexer 123b may output the first signal S12 through a signal line connected to another one of the second and fourth groups G2 and G4.

At this time, when the two first signals S11 and S12 are output to the second and fourth groups G2 and G4, respectively, depending upon whether a repair operation is performed, the signals may be repaired in the second and fourth groups G2 and G4 or the signals may be delivered to the fifth group G5 through the second and fourth groups G2 and G4 and repaired in the fifth group G5.

In addition, RTSVs included in the first group G1 may receive a signal for repairing a TSV failure from the second or fourth group G2 or G4.

Specifically, the third demultiplexer 123c receives the second signal S2 from a RTSV included in the second group G2. When a RTSV to which the third demultiplexer 123c belongs is capable of repairing, the second signal S2 is output through a signal line connected to the corresponding RTSV.

On the other hand, when a RTSV to which the third demultiplexer 123c belongs is incapable of repairing, the second signal S2 may be output through a signal line connected to the fourth group G4. In other words, RTSVs included in the first group G1 may deliver the second signal S2 to the fourth group G4 to repair a failure generated in the second group G2.

The fourth demultiplexer 123d receives the third signal S3 from a RTSV included in the fourth group G4 and then, may output the signal to a signal line connected to a corresponding RTSV or to a signal line connected to the second group G2.

Since specific operation principle related to this is the same as in the case of the third demultiplexer 123c, a detailed description thereof will be omitted.

In FIG. 6, one RTSV is illustrated and described as including two demultiplexers 123a and 123b for receiving the first signals S11 and S12, but the number of demultiplexers for receiving the first signals may be more than two.

For example, when one RTSV includes three demultiplexers that receive first signals S11, S12 and S13, respectively, the first signal S11 may be repaired within a corresponding RTSV, and the remaining first signals S12 and S13 may repaired using RTSVs included in adjacent groups. In this case, a maximum of three failures may be repaired based on one RTSV.

Figure 7:
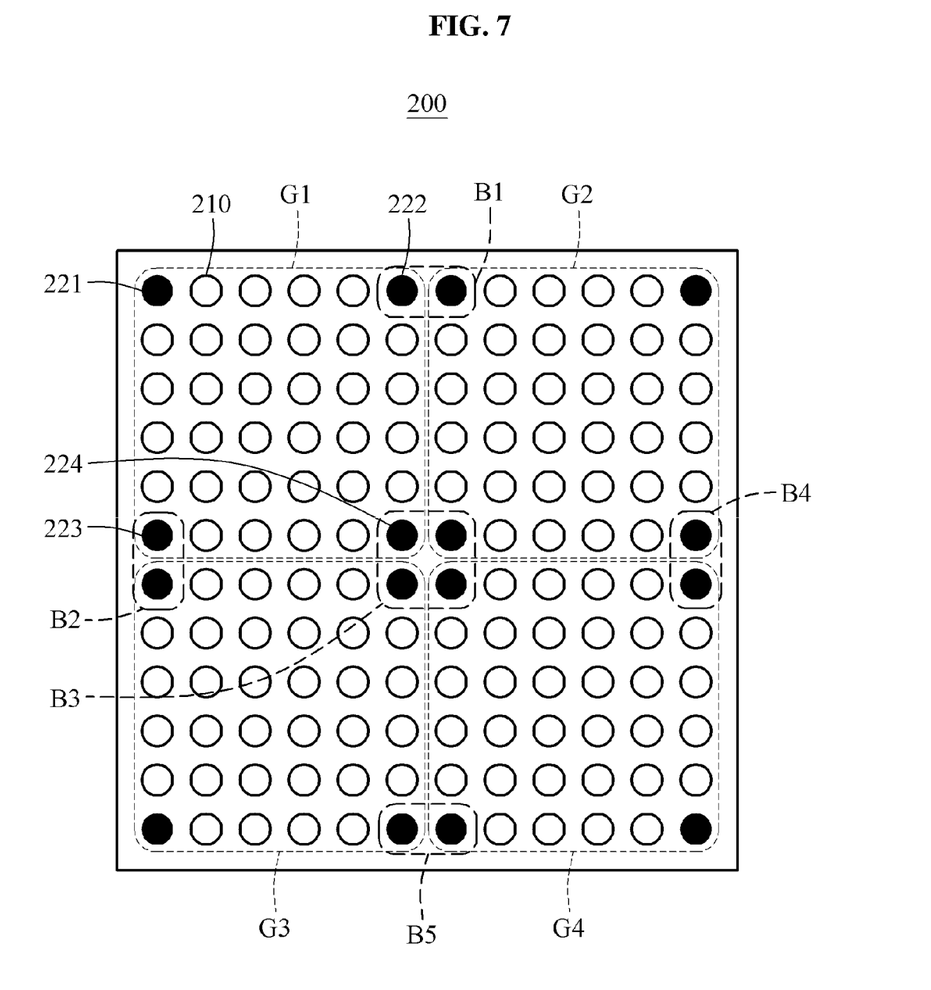
FIG. 7 illustrates a top view of a three-dimensional integrated circuit according to another embodiment of the present invention.

FIG. 7 illustrates a top view of a three-dimensional integrated circuit according to another embodiment of the present invention.

Referring to FIG. 7, a three-dimensional integrated circuit 200 includes a plurality of vertically stacked semiconductor chips (not illustrated), a plurality of through-silicon vias (TSVs) 210, and a plurality of redundant through-silicon vias (RTSVs) 221 and 222. Here, the TSVs 210 and the RTSVs 221, 222, 223 and 224 perform the same function or operation as those of vias shown in FIG. 1, except that the number and the arrangement structure of vias included in one group are different.

The three-dimensional integrated circuit 200 is divided into four groups G1, G2, G3 and G4, and each group includes 32 TSVs 210 and four RTSVs 221 to 224, wherein a total of 36 vias is arranged in a 6×6 matrix, and the first to fourth groups G1 to G4 are arranged in a 2×2 matrix.

The RTSVs 221 to 224 included in each group repair at least one failed TSV within the group including the RTSVs 221 to 224.

In addition, when the number of failed TSVs exceeds a repairable number in a group including the TSVs, the failed TSVs exceeding the repairable number may be repaired using RTSVs included in another group adjacent to the group.

RTSVs 121 and 122 included in each group are placed at each of four corners within the group including the same and may be arranged to be symmetrical with respect to RTSVs included in adjacent groups.

Due to the arrangement structure, RTSVs between adjacent groups may be arranged adjacent to each other, making it easy to share the RTSVs. As shown in FIG. 7, the bundles of RTSVs that can be shared between adjacent groups are denoted as B1, B2, B3, B4 and B5.

Figure 8:
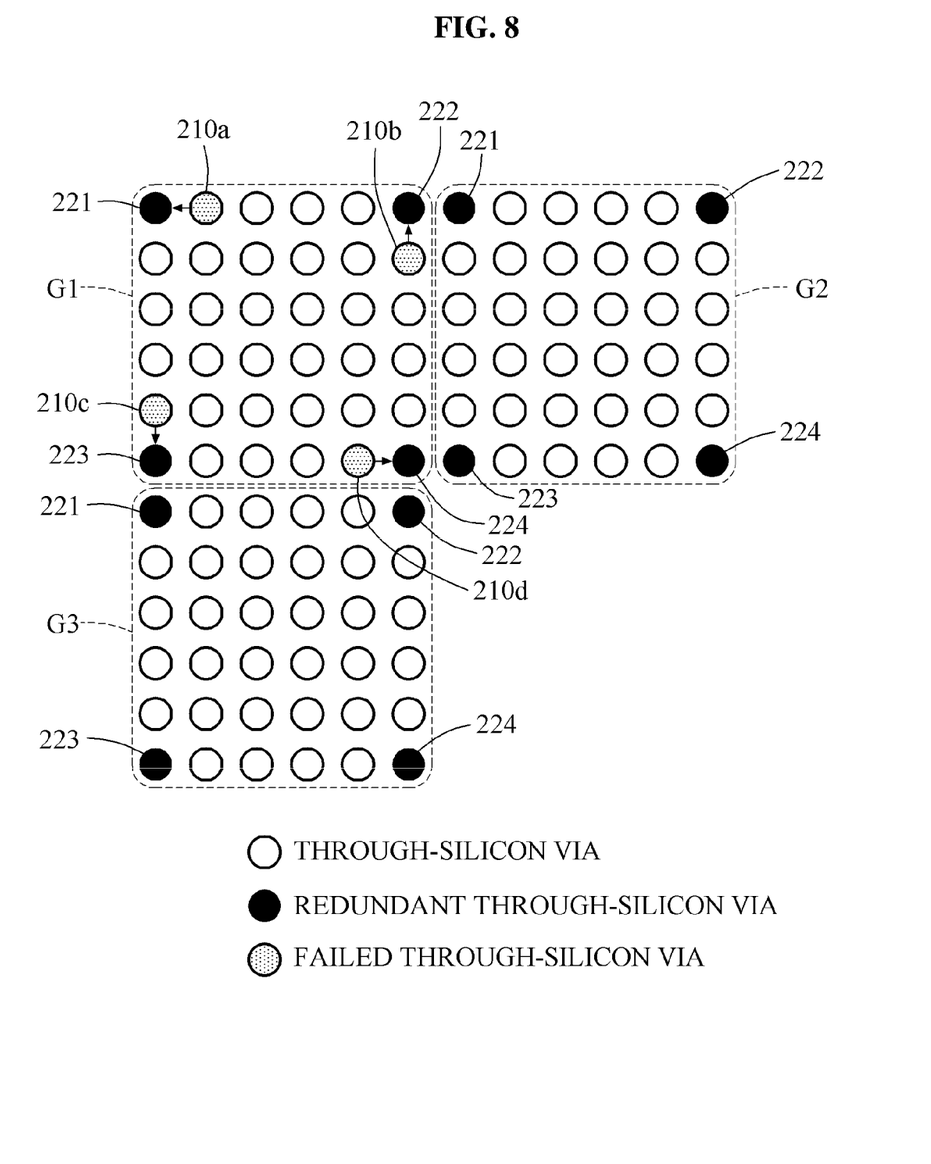
FIGS. 8 and 9 illustrate a repair method according to the number of failures having occurred in TSVs on the three-dimensional integrated circuit shown in FIG. 7.
Figure 9:
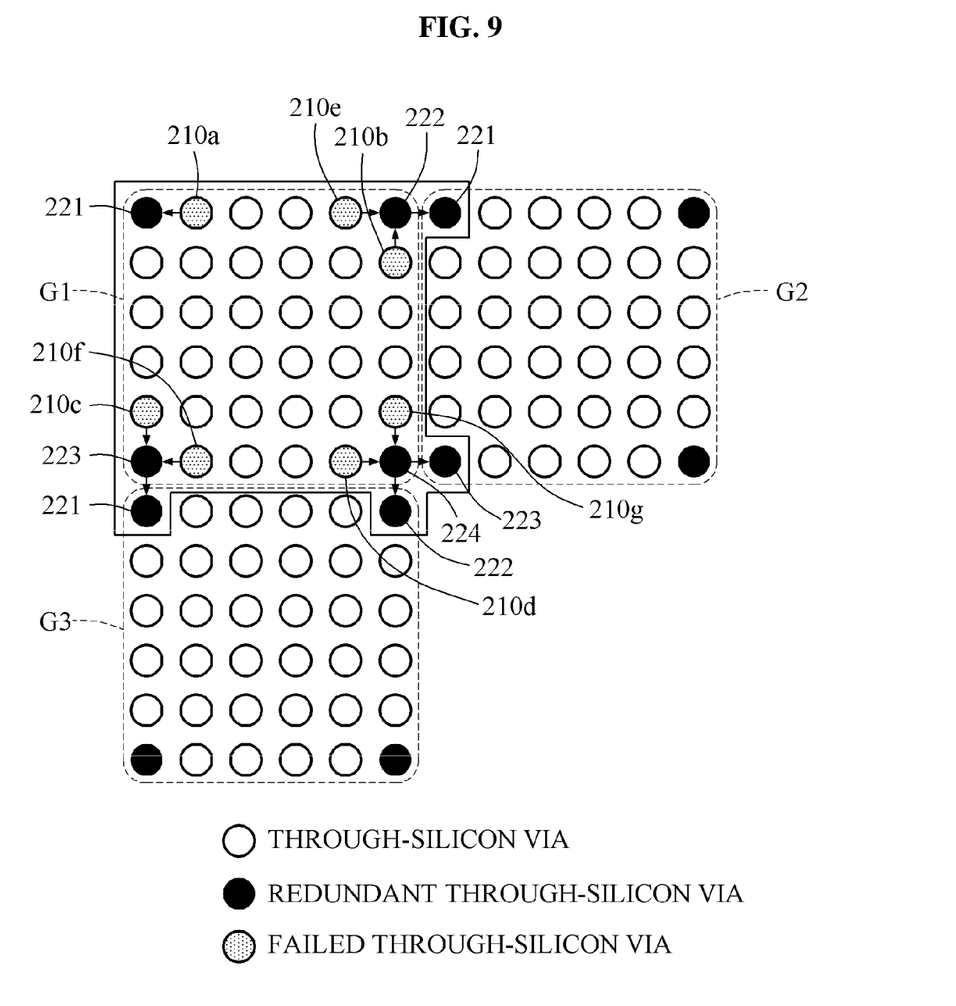

FIGS. 8 and 9 illustrate a repair method according to the number of failures having occurred in TSVs on the three-dimensional integrated circuit shown in FIG. 7.

According to examples shown in FIGS. 8 to 9, when the first group G1 is centered, the second group G2 is located on the right side of the first group G and the third group G3 is located on the underside of the first group G1. Crosstalk for repairing failures between these three groups may be equally or similarly applied to other groups.

The RTSVs 221 to 224 included in the first group G1 are placed at four corners and are arranged to be symmetrical with respect to the RTSVs 221 to 224 included in each of the second and third groups G2 and G3.

When four TSV failures occur in the first group G1, the failures may be repaired using four RTSVs included in the first group G1.

Specifically, the TSV failures may be repaired by shifting the signal of a first TSV 210a to a first RTSV 221, shifting the signal of a tenth TSV 210b to a second RTSV 222, and shifting the signal of the 23rd TSV 210c to a third RTSV 223.

In addition, the TSV failure may be repaired by shifting the signal of a 32nd TSV 210d to a fourth RTSV 224.

As described above, when four TSV failures occur in the first group G1, the number of TSV failures corresponds to the repairable number within the first group G1 and thus the TSV failures may be repaired using the RTSVs 221 to 224 alone.

However, when more than four TSV failures occur in the first group G1, the TSV failures may be repaired using at least one RTSV included in adjacent groups. This is shown in FIG. 9 in detail.

As shown in FIG. 9, when seven failures occur in the first group G1, the number of failures within the first group G1 exceeds the repairable number by four.

As shown in FIG. 8, when the first, tenth, 23rd and 32nd TSVs 210a, 210b, 210c and 210d fail to function and thus four failures occur, the failures may be repaired using the four RTSVs 221 to 224 included in the first group G1.

Since three failures cannot be repaired within the first group G1, the failures may be repaired using RTSVs included in the second and third groups G2 and G3.

Specifically, as shown in FIG. 9, the signal of a fourth TSV 210e is shifted to the first RTSV 221 included in the second group G2, the signal of a 29th TSV 210f is shifted to the first RTSV 221 included in the third group G3 and the signal of a 28th TSV 210g is shifted to the second RTSV 222 included in the third group.

In this case, the first RTSV 221 included in the second group G2 and the first and second RTSVs 221 and 222 included in the third group G3 may operate in one configuration of the first group G1.

As described above, the three-dimensional integrated circuit 200 has a structure that shares RTSVs between the first and second groups G1 and G2 and shares RTSVs between the first and third groups G1 and G3, and thus all seven failures occurring in one group may be repaired.

In addition, although not shown and explained in figures, in the three-dimensional integrated circuit 200, when another groups are adjacent to each of the left side, right side, upper side, underside and diagonal direction of the first group G1, a maximum of 8 failures may be repaired using RTSVs included in the other groups adjacent to the first group G1.

In other words, four TSV failures may be repaired within the first group G1, and another four TSV failures may be further repaired using RTSVs included in adjacent groups.

According to embodiments of the present invention, the three-dimensional integrated circuit can repair more failures than the number of RTSVs included in each group by sharing RTSVs with adjacent groups.

Although the present invention has been described through limited examples and figures, the present invention is not intended to be limited to the examples. Those skilled in the art will appreciate that various modifications, additions and substitutions are possible, without departing from the scope and spirit of the invention.

It should be understood, however, that there is no intent to limit the invention to the embodiments disclosed, rather, the invention is to cover all modifications, equivalents, and alternatives falling within the spirit and scope of the invention as defined by the claims.

What is claimed is:

1. A three-dimensional integrated circuit divided into a plurality of groups, the three-dimensional integrated circuit comprising:
   a plurality of through-silicon vias (TSVs) vertically penetrating the three-dimensional integrated circuit and comprised in each of the groups; and
   two or more redundant through-silicon vias (RTSVs) vertically penetrating the three-dimensional integrated circuit and comprised in each of the groups,
   wherein an RTSV of two or more RTSVs in one group of the plurality of groups is configured to receive a signal of a first failed TSV of a plurality of TSVs in the one group and process the signal of the first failed TSV in the RTSV of the two or more RTSVs in the one group when a number of failed TSVs among the plurality of TSVs in the one group does not exceed a repairable number, and wherein each of the failed TSVs does not normally perform a function as an electrode, and the repairable number is a number of RTSVs capable of replacing functions of the failed TSVs in the one group, and wherein the RTSV of the two or more RTSVs in the one group is configured to receive the signal of the first failed TSV of the plurality of TSVs in the one group, process the signal of the first failed TSV in the RTSV of the two or more RTSVs in the one group, receive a signal of a second failed TSV of the plurality of TSVs in the one group and output the signal of the second failed TSV to an RTSV of two or more RTSVs in another group of the plurality of groups such that a function of the second failed TSV is performed by the RTSV in the another group when the number of failed TSVs among the plurality of TSVs in the one group exceeds the repairable number, the another group being adjacent to the one group.

2. The three-dimensional integrated circuit according to claim 1, wherein the adjacent group is a group arranged to be adjacent to one of an upper side, underside, left side, right side and diagonal directions of the one group.

3. The three-dimensional integrated circuit according to claim 1, wherein the RTSVs together with the plurality of TSVs are arranged in an m×n matrix (m and n being natural numbers) in each of the groups, and the RTSVs are placed at two or more corners of each of the groups.

4. The three-dimensional integrated circuit according to claim 3, wherein, when the RTSVs are placed at two corners of each of the groups, the RTSVs are placed to face each other within each of the groups and are arranged to be symmetrical with respect to RTSVs comprised in another group adjacent to each of the groups.

5. The three-dimensional integrated circuit according to claim 1, wherein TSV failures corresponding to a maximum of two times the number of RTSVs comprised in each of the groups are repaired using at least one RTSV comprised in another group adjacent to each of the groups.

6. The three-dimensional integrated circuit according to claim 1, wherein each of the RTSVs comprises:
   first and second demultiplexers that receive a first signal from at least one failed TSV in each of the groups comprising the RTSVs and output the same;
   a third demultiplexer that receives a second signal from RTSVs comprised in a first group of other groups adjacent to each of the groups and outputs the same; and
   a fourth demultiplexer that receives a third signal from RTSVs comprised in a second group of the other groups adjacent to each of the groups and outputs the same.

7. The three-dimensional integrated circuit according to claim 6, wherein,
   when the first signal is received, whether an RTSV to which a corresponding first demultiplexer belongs is capable of repairing a failure of the failed TSV is determined,
   when the RTSV is capable of repairing the failure of the failed TSV, the first signal is output to a signal line connected to the RTSV to which the corresponding first demultiplexer belongs, and
   when the RTSV is incapable of repairing the failure of the failed TSV, the first signal is output to any one of signal lines connected to the first and second groups, and
   wherein the RTSV is determined to be incapable of repairing the failure of the failed TSV when the RTSV is already performing a repair operation or unable to repair due to a failure in the RTSV.

8. The three-dimensional integrated circuit according to claim 6, wherein,
   when the first signal is received, whether an RTSV to which a corresponding second demultiplexer belongs is capable of repairing a failure of the failed TSV is determined,
   when the RTSV is capable of repairing the failure of the failed TSV, the first signal is output to a signal line connected to the RTSV to which the corresponding second demultiplexer belongs, and
   when the RTSV is incapable of repairing the failure of the failed TSV, the first signal is output to any one of signal lines connected to the first and second groups, and
   wherein the RTSV is determined to be incapable of repairing the failure of the failed TSV when the RTSV is already performing a repair operation or unable to repair due to a failure in the RTSV.

9. The three-dimensional integrated circuit according to claim 6, wherein,
   when an RTSV to which a corresponding third demultiplexer belongs is capable of repairing a failure of a failed TSV, the received second signal is output to a signal line connected to the RTSV, and
   when the RTSV to which the corresponding third demultiplexer belongs is incapable of repairing the failure of the failed TSV, the received second signal is output to a signal line connected to the second group, and
   wherein the RTSV is determined to be incapable of repairing the failure of the failed TSV when the RTSV is already performing a repair operation or unable to repair due to a failure in the RTSV.

10. The three-dimensional integrated circuit according to claim 6, wherein,
    when an RTSV to which a corresponding fourth demultiplexer belongs is capable of repairing a failure of a failed TSV, the received third signal is output to a signal line connected to the RTSV, and
    when the RTSV to which the corresponding fourth demultiplexer belongs is incapable of repairing the failure of the failed TSV, the received third signal is output to a signal line connected to the first group, and
    wherein the RTSV is determined to be incapable of repairing the failure of the failed TSV when the RTSV is already performing a repair operation or unable to repair due to a failure in the RTSV.

* * * * *